United States Patent
Teng

(10) Patent No.: US 8,618,874 B2
(45) Date of Patent: Dec. 31, 2013

(54) CALIBRATION OF SIGNAL PROCESSING APPARATUS

(75) Inventor: Robert Hwat Hian Teng, Zurich (CH)

(73) Assignee: ST-Ericsson SA, Plan-les-Ouates (CH)

( * ) Notice: Subject to any disclaimer, the term of this patent is extended or adjusted under 35 U.S.C. 154(b) by 59 days.

(21) Appl. No.: 13/505,026

(22) PCT Filed: Oct. 29, 2010

(86) PCT No.: PCT/EP2010/006618
§ 371 (c)(1), (2), (4) Date: Apr. 30, 2012

(87) PCT Pub. No.: WO2011/050973
PCT Pub. Date: May 5, 2011

(65) Prior Publication Data
US 2012/0218037 A1 Aug. 30, 2012

(30) Foreign Application Priority Data
Oct. 30, 2009 (EP) .................................... 09252517

(51) Int. Cl.
*H03F 1/02* (2006.01)
(52) U.S. Cl.
USPC .............................................. 330/9; 327/124
(58) Field of Classification Search
USPC ............ 330/9, 124 R, 295, 84, 126; 327/124, 327/307
See application file for complete search history.

(56) References Cited

U.S. PATENT DOCUMENTS

| | | | |
|---|---|---|---|
| 6,498,530 B1 | 12/2002 | Tang | |
| 7,184,799 B1 | 2/2007 | Jin et al. | |
| 7,265,615 B2 * | 9/2007 | Alexander et al. | 330/69 |
| 7,557,650 B2 * | 7/2009 | Giraud et al. | 330/10 |
| 8,099,073 B1 * | 1/2012 | Muller et al. | 455/296 |
| 8,169,249 B2 * | 5/2012 | Li et al. | 327/307 |
| 2006/0152282 A1 | 7/2006 | Halbert et al. | |
| 2006/0152288 A1 | 7/2006 | Peng et al. | |
| 2006/0182266 A1 | 8/2006 | Cusinato et al. | |
| 2008/0258809 A1 | 10/2008 | Yen | |
| 2009/0245541 A1 | 10/2009 | Wang | |

OTHER PUBLICATIONS

Patent Cooperation Treaty; International Search Report and Written Opinion of PCT/EP2010/006618; Dec. 13, 2010; Agerbaek, Thomas; 9 pages.
European Search Report of App. EP 09252517.9; May 25, 2010; Agerbaek, Thomas; 4 pages.

* cited by examiner

*Primary Examiner* — Henry Choe
(74) *Attorney, Agent, or Firm* — Howison & Arnott, L.L.P.

(57) ABSTRACT

A signal processing apparatus is provided that comprises a signal path including first and second signal processing stages for processing a signal. A switch, in a first state couples and in a second state de-couples an output of the first signal processing stage to an input of the second signal processing stage. An auxiliary stage coupled to the output of the first signal processing stage generates a control signal dependent to a DC level at the output of the first signal processing stage, on a DC level in the auxiliary stage, and indicates a DC offset at an output of the second signal processing stage. A calibration circuit, responsive to the control signal, adjusts a DC level in the signal path preceding the output of the first signal processing stage when the switch is in the second state.

11 Claims, 3 Drawing Sheets

CALIBRATION OF SIGNAL PROCESSING APPARATUS

CROSS-REFERENCE TO RELATED APPLICATIONS

This application is a U.S. National Phase application submitted under 35 U.S.C. §371 of Patent Cooperation Treaty application serial no. PCT/EP2010/006618, filed Oct. 29, 2010, and entitled CALIBRATION OF SIGNAL PROCESSING APPARATUS, which application claims priority to European patent application serial no. EP 09252517.9, filed Oct. 30, 2010, and entitled CALIBRATION OF SIGNAL PROCESSING APPARATUS.

Patent Cooperation Treaty application serial no. PCT/EP2010/006618, published as WO 2011/050973, and European Patent application serial no. EP 09252517.9, are incorporated herein by reference.

TECHNICAL FIELD

The present disclosure relates to a signal processing apparatus and method, and has application in systems in which is it required to calibrate a direct current (DC) level of the signal processing apparatus, for example the DC level of an audio system such as a mobile phone, MP3 player and hi fi equipment.

BACKGROUND

In signal processing apparatus, a DC voltage offset from an ideal value in a signal path can be disadvantageous because it can reduce the dynamic range available for a signal, and it can reduce power efficiency due to the flow of DC currents. A DC voltage can also cause transient noise when a quiescent DC voltage is established after a power supply to a signal processing apparatus is switched on, and when the quiescent DC voltage decays after the power supply is switched off. Therefore, there is a requirement to reduced DC offset and DC voltage and current in signal processing apparatus.

A calibration arrangement may be employed in which a DC level in a signal processing apparatus is measured and, in response to the measured DC level, the DC level in the signal processing apparatus is adjusted to reduce its offset from a desired value. If the DC level is measured at the output of the signal processing apparatus, then a prerequisite is that power has been applied, and consequently transient noise may have been generated and passed to other equipment coupled to the signal processing apparatus. Alternatively, if the DC level is measured at an earlier stage of the signal path, any DC offset in a subsequent stage or stages is not taken into account during the calibration process, resulting in a residual DC offset at the output of the signal processing apparatus. In either case, in order to avoid introducing an inaccuracy to the measurement, a measurement device having a very low DC offset is used, and such a measurement device can occupy a large silicon area and reduce power efficiency. Also, trials with sensitive audio headsets have shown that, in audio signal processing apparatus, a step in DC level as small as 100 µV can generate audible noise. Therefore, noise can be generated during calibration.

Therefore, there is a requirement for improved calibration of signal processing apparatus.

SUMMARY

According to a first aspect, there is provided a signal processing apparatus comprising:

a signal path including first and second signal processing stages for processing a signal;

a switch means for, in a first state, coupling an output of the first signal processing stage to an input of the second signal processing stage, and, in a second state, de-coupling the output of the first signal processing stage from the input of the second signal processing stage;

an auxiliary stage coupled to the output of the first signal processing stage and arranged to generate a control signal dependent on a DC level at the output of the first signal processing stage and on a DC level in the auxiliary stage and indicative of a DC offset at an output of the second signal processing stage; and calibration means for, responsive to the control signal, adjusting a DC level in the signal path at a location preceding the output of the first signal processing stage when the switch means is in the second state.

According to a second aspect, there is provided a method of operating a signal processing apparatus comprising a signal path including first and second signal processing stages for processing a signal and comprising an auxiliary stage coupled to an output of the first signal processing stage, the method comprising:

for processing the signal, coupling the output of the first signal processing stage to an input of the second signal processing stage; and for calibrating the signal processing apparatus,
de-coupling the output of the first signal processing stage from the input of the second signal processing stage,
generating in the auxiliary stage a control signal dependent on a DC level at the output of the first signal processing stage and on a DC level in the auxiliary stage and indicative of a DC offset at an output of the second signal processing stage, and
adjusting, responsive to the control signal, a DC level in the signal path at a location preceding the output of the first signal processing stage.

Therefore, whereas in normal operation a signal can be processed by the first and second signal processing stages, calibration of a DC level can be performed using the auxiliary stage in place of the second signal processing stage. The effect of the DC level in the auxiliary stage may be present during the calibration process, and the DC level in the signal path preceding the output of the first signal processing stage may be adjusted dependent on the control signal, which can be indicative of the DC level at an input of the first signal processing stage, the DC offset of the first signal processing stage, and the DC level in the auxiliary stage. In effect, the DC offset of the second signal processing stage may be substituted by the DC level in the auxiliary stage for the purpose of calibrating the DC level in the signal processing apparatus. This feature enables the DC level of the whole signal processing apparatus to be calibrated without changing the DC level of the second signal processing stage, and therefore without generating a transient effect in apparatus connected to an output of the second signal processing stage.

Optionally, the second signal processing stage can be enabled by the switch means to receive a supply of power when the switch means is in the first state and at least part of the second signal processing stage can be disabled by the switch means from receiving the supply of power when the switch means is in the second state. Likewise, the method can optionally comprise enabling the second signal processing stage to receive a supply of power for processing the signal and disabling at least part of the second signal processing stage from receiving the supply of power for calibration of the signal processing apparatus. This feature enables transient noise at the output of the second signal processing stage to be reduced or eliminated during adjustment of the DC level.

Optionally, the auxiliary stage can be coupled to the first signal processing stage by the switch means when the switch means is in the second state and de-coupled from the first signal processing stage by the switch means when the switch means is in the first state. Likewise, the method can comprise coupling the auxiliary stage to the first signal processing means for calibration of the signal processing apparatus and de-coupling the auxiliary stage from the first signal processing means for processing the signal. This feature enables processing of the signal to proceed unaffected by the auxiliary stage.

Optionally, the second signal processing stage can comprise a first amplifier and the auxiliary stage can comprise a second amplifier, wherein the second amplifier is a copy of the first amplifier. Likewise, the method can optionally comprise providing the first signal processing stage with a first amplifier and providing the auxiliary stage with a second amplifier, wherein the second amplifier is a copy of the first amplifier. This feature provides a simple and accurate way of providing the second signal processing stage and the auxiliary stage with DC levels which have an equal value.

Optionally, the second signal processing stage can comprise a feedback path for operating the first amplifier with feedback, and the second amplifier can be arranged to be operated without feedback. Likewise, the method can optionally comprise operating the first amplifier with feedback, and operating the second amplifier without feedback. This feature can enable linear amplification in the second signal processing stage and non-linear amplification in the auxiliary stage, thereby facilitating generation of the control signal in a simple and accurate manner. By the use of non-linear amplification, the control signal can be generated simply and accurately with a fast slew rate, which facilitates the use of low power digital and/or analogue circuitry for processing the control signal, without a stringent requirement on the switching threshold of the digital circuitry.

Optionally, the feedback path can couple an output of the second signal processing stage to the signal path at a location preceding the output of the first signal processing stage. Likewise, the method can comprise coupling the feedback path between an output of the second signal processing stage and a location in the signal path preceding the output of the first signal processing stage. This feature enables the auxiliary stage to generate the control signal dependent on a DC level within a feedback loop formed by the feedback path, thereby enabling improved calibration.

Optionally, the switch means can be arranged to, in the second state, couple the output of the second signal processing stage to a reference voltage and, in the first state, de-couple the output of the second signal processing stage from the reference voltage. Likewise, the method can optionally comprise, for calibrating the signal processing apparatus, coupling the output of the second signal processing stage to a reference voltage and, for processing the signal, de-coupling the output of the second signal processing stages from the reference voltage. This feature provides a feedback voltage during calibration and enables improved calibration.

Optionally, the first amplifier can comprise at least one first transistor, and the second amplifier can comprise at least one second transistor having one or more physical dimensions which are a scaled down copy of one or more physical dimensions of the at least one first transistor. Likewise, the method can optionally comprise providing the first amplifier with at least one first transistor, and the second amplifier with at least one second transistor having one or more physical dimensions which are a scaled down copy of one or more physical dimensions of the at least one first transistor. This feature enables the first and second amplifiers to establish a substantially equal value DC levels whilst consuming less power in the second amplifier than in the first amplifier.

Optionally, the at least one first transistor can comprise a first p-channel metal oxide semiconductor, PMOS, transistor and a first n-channel metal oxide semiconductor, NMOS, transistor with their gates coupled to an input of the first amplifier and their drains coupled to an output of the first amplifier, and the at least one second transistor can comprise a second PMOS transistor and a second NMOS transistor with their gates coupled to an input of the second amplifier and their drains coupled to an output of the second amplifier. This feature can enable a simple implementation of the first amplifier and the second amplifier.

The signal processing apparatus can comprise power conservation means for conserving power by disabling at least part of the auxiliary stage between adjustments of the DC level. Likewise, the method can comprise conserving power by disabling at least part of the auxiliary stage between adjustments of the DC level. This enables power consumption to be reduced when not calibrating the signal processing apparatus.

BRIEF DESCRIPTION OF THE DRAWINGS

Embodiments will now be described, by way of example only, with reference to the accompanying drawings, in which.

DETAILED DESCRIPTION

Figure 1:
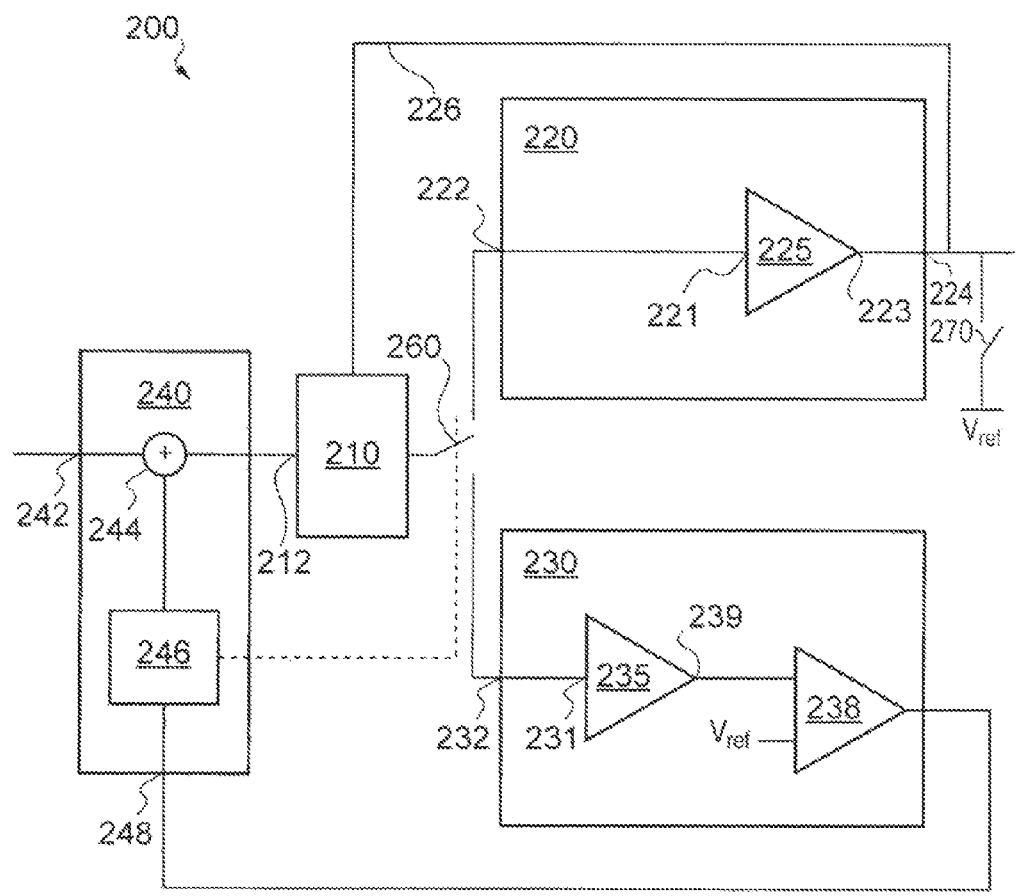
FIG. 1 is a block diagram of a signal processing apparatus.

Referring to FIG. 1, a signal processing apparatus 200 has an input 242 for a signal to be processed and an output 224 for the signal after it has been processed by the signal processing apparatus 200. Coupled between the input 242 of the signal processing apparatus 200 and the output 224 of the signal processing apparatus 200 is a signal path. The signal path comprises: a calibration stage 240 having an input coupled to the input 242 of the signal processing apparatus 200; a first signal processing stage 210 for processing the signal and having an input 212 coupled to an output of the calibration stage 240; and a second signal processing stage 220 for processing the signal having an input 222 coupled to an output of the first signal processing stage 210 and an output coupled to the output 224 of the signal processing apparatus 200. The output 224 of the signal processing apparatus 200 is also the output of the second signal processing stage 220. A feedback path 226 is coupled between the output 224 of the signal processing apparatus 200 and the signal path in the first signal processing stage 210. An output switch 270 is coupled between the output 224 of the signal processing apparatus 200 and a reference voltage $V_{ref}$. The reference voltage $V_{ref}$ is chosen such that no, or very little, current flows into or out of the output 224 of the signal processing apparatus 200 during calibration. Typically, where the signal processing apparatus 200 is powered by a first supply rail providing a first voltage $V_{DD}$ and a second supply rail providing a lower second voltage $V_{SS}$, the reference voltage $V_{ref}$ is the average of the first and second voltages $V_{DD}$, $V_{SS}$ or $(V_{DD}+V_{SS})/2$. Coupled in the signal path between the first signal processing stage 210 and the second signal processing stage 220 is a routing switch 260 for selectively, under the control of a calibration stage 240, routing the signal from the output of the first signal processing stage 210 to either the input 222 of the second signal processing stage 220 or an input 232 of an auxiliary stage 230. The auxiliary stage 230 generates a control signal and has an output coupled to an input 248 of the calibration stage 240 for delivering the control signal to the calibration stage 240.

The signal processing apparatus 200 is operated in a first mode, which is referred to as a calibration mode, without a signal applied at the input 242 of the signal processing apparatus 200, and in a second mode in which a signal applied at the input 242 of the signal processing apparatus 200 is processed by the first and second signal processing stages 210, 220, which is referred to as a normal operation mode. In the calibration mode, in the absence of a signal applied at the input 242 of the signal processing apparatus 200, the calibration stage 240 controls the routing switch 260 to couple the output of the first signal processing stage 210 to the input 232 of the auxiliary stage 230, and controls the output switch 270 to couple the output 224 of the signal processing apparatus 200 to the reference voltage $V_{ref}$ to ensure that the reference voltage $V_{ref}$ is coupled to the feedback path 226. In this mode, the DC level at the input 232 of the auxiliary stage 230 is dependent on the DC level at the input 212 of the first signal processing stage 210 and on the DC offset of the first signal processing stage 210. The auxiliary stage 230 generates the control signal dependent on the DC level at its input 232 and on a DC level in the auxiliary stage 230. In response to the control signal the calibration stage 240 adjusts the DC level in the signal path preceding the output of the first signal processing stage 210 in order to reduce the deviation from a desired value of the DC level in the auxiliary stage 230. In response to the DC level in the auxiliary stage 230 reaching the desired value, as indicated by the control signal, the calibration stage 240 controls the routing switch 260 to couple the output of the first signal processing stage 210 to the input 222 of the second signal processing stage 220, and then controls the output switch 270 to de-couple the output 224 of the signal processing apparatus 200 from the reference voltage $V_{ref}$. In this state, the calibration mode ceases and the normal operation mode commences, with a signal received at the input 242 of the signal processing apparatus 200 being processed by the first and second signal processing stages 210, 220 and delivered at the output 224 of the signal processing apparatus 200.

Any DC offset introduced by the second signal processing stage 220 does not affect the control signal during the calibration mode, so is not taken into account during the calibration process. However, the DC level in the auxiliary stage 230 does affect the control signal and so is taken into account during the calibration process. Therefore, the adjustment of the DC level in the signal path is performed with the final stage of the signal path replaced by the auxiliary stage 230. If the DC level in the auxiliary stage 230 is indicative of the DC offset of the second signal processing stage 220, the DC level adjustment made during the calibration mode will be valid during the normal operation mode with the second signal processing stage 220 restored to the signal path. In this way, it is not necessary for the auxiliary stage 230 to have a very small effect on the DC level; a larger effect on the DC level is acceptable provided it is sufficiently indicative of the DC offset of the second signal processing stage 220 to provide an acceptable calibration. The degree of similarity desirable between the DC offset of the second signal processing stage 220 and the effect of the auxiliary stage 230 on the DC level is dependent on the application. However, in some applications, it is preferably that the effect of the auxiliary stage 230 on the DC level is substantially identical to the DC offset of the second signal processing stage 220.

Additional aspects will now be described with reference to FIG. 1. The calibration stage 240 comprises a summing stage 244 for summing any signal received at the input 242 of the signal processing apparatus 200 with a DC level generated by a calibration controller 246 in response to the control signal received at the input 248, although no signal is applied at the input 242 of the signal processing apparatus 200 during the calibration mode. The auxiliary stage 230 has an auxiliary amplifier 235 having an input 231 coupled to the input 232 of the auxiliary stage 230. The auxiliary amplifier 235 has a high gain such that it operates as a comparator, delivering at its output a voltage corresponding to the first or second voltages $V_{DD}$, $V_{SS}$ of upper or lower supply rails respectively, according to whether the DC level at the input 231 of the auxiliary amplifier 235 is above or below a comparison threshold of the auxiliary amplifier 235. In particular, the high gain may be provided by operating the amplifier 235 without feedback. The comparison threshold of the auxiliary amplifier 235 is arranged to correspond to a desired DC level at the output 224 of the signal processing apparatus 200 during normal operation but with no signal applied at the input 242 of the signal processing apparatus 200, in other words, a desired quiescent DC level at the output 224 of the signal processing apparatus 200. Therefore, transitions in the voltage at the output of the auxiliary amplifier 235 indicate when the DC level at the input 231 of the auxiliary amplifier 235 passes through the comparison threshold, and consequently also indicate when the DC level at the input 222 of the second signal processing stage 220 is at the level required to produce the desired quiescent DC level at the output 224 of the signal processing apparatus 200.

The output 239 of the auxiliary amplifier 235 is coupled to a first input of a comparator 238. The comparator 238 has a second input for the reference voltage $V_{ref}$, although it is not essential for this voltage to be the same as the reference voltage $V_{ref}$ coupled to the output switch 270. An output of the comparator 238 is coupled the output of the auxiliary stage 230 and delivers the control signal as a binary signal dependent on whether the voltage at the output of the auxiliary amplifier 235 is above or below the reference voltage $V_{ref}$. As the voltage at the output of the auxiliary amplifier 235 has fast transitions between the upper or lower voltage rails, the value of the reference voltage $V_{ref}$ at the second input of the comparator 238 need not be established with a high degree of precision as a deviation in the value of $V_{ref}$ will not cause significant deviation in the time of transitions at the output of the comparator 238, and therefore not introduce a significant error into the indication by the control signal of whether the DC level at the input 222 of the second signal processing stage 220 is at the level required to produce the desired quiescent DC level at the output 224 of the signal processing apparatus 200. The comparator 238 functions as a buffer to provide the control signal in a binary format suitable for use by the calibration stage 240, but may be omitted if the signal at the output 239 of the auxiliary amplifier 235 is suitable for use directly by the calibration stage 240. In an alternative embodiment, the comparator 238 may be replaced by a digital inverter, which does not require the second input for the reference voltage $V_{ref}$.

If the control signal indicates that the DC level at the input 222 of the second signal processing stage 220 is above the level required to produce the desired quiescent DC level at the output 224 of the signal processing apparatus 200, the calibration controller 246 decreases the DC level that it supplies to the summing stage 244, and if the control signal indicates that the DC level at the input 222 of the second signal processing stage 220 is below the level required to produce the desired quiescent DC level at the output 224 of the signal processing apparatus 200, the calibration controller 246 increases the DC level that it supplies to the summing stage 244. An iterative approach may be taken, with a rising transition in the control signal indicating that the DC level at the input 222 of the second signal processing stage 220 has passed from being too low to too high, and a falling transition in the control signal indicating that the DC level at the input 222 of the second signal processing stage 220 has passed from being too high to too low. When an acceptable DC level at the input 231 of the auxiliary amplifier 235 has been reached, the calibration controller maintains the DC level that it is currently applying to the summing stage 244, and operates the routing switch 260 to couple the output of the first signal processing stage 210 to the input 222 of the second signal processing stage 220, and the signal to be processed by the signal processing apparatus 200 is applied at the input 242 of the signal processing apparatus 200, thereby adopting the normal operation mode. Calibration can be repeated whenever desired to take account of variations in DC levels, for example, at power-on or after temperature changes, or in the absence of a signal to be processed.

The second signal processing stage 220 comprises signal path amplifier 225 having input 221 coupled to the input 222 of the second signal processing stage 220 and an output 223 coupled to the output 224 of the signal processing apparatus 200. The signal path amplifier 225 has an internal gain, and the feedback path 226 and the first signal processing stage 210 in combination define the overall gain of the second signal processing stage 220, enabling the second signal processing stage 220 to amplify in a linear manner.

If the electrical behavior of the signal path amplifier 225 and the auxiliary amplifier 235 is equivalent under the same electrical conditions, then the DC adjustment determined by the calibration controller 246 during the calibration mode will be valid during the normal operation mode for maintaining the desired quiescent DC level at the output 224 of the signal processing apparatus 200. A good match between the electrical behavior of the signal path amplifier 225 and the auxiliary amplifier 235 can be arranged if the auxiliary amplifier 235 is a copy of the signal path amplifier 225.

Figure 2:
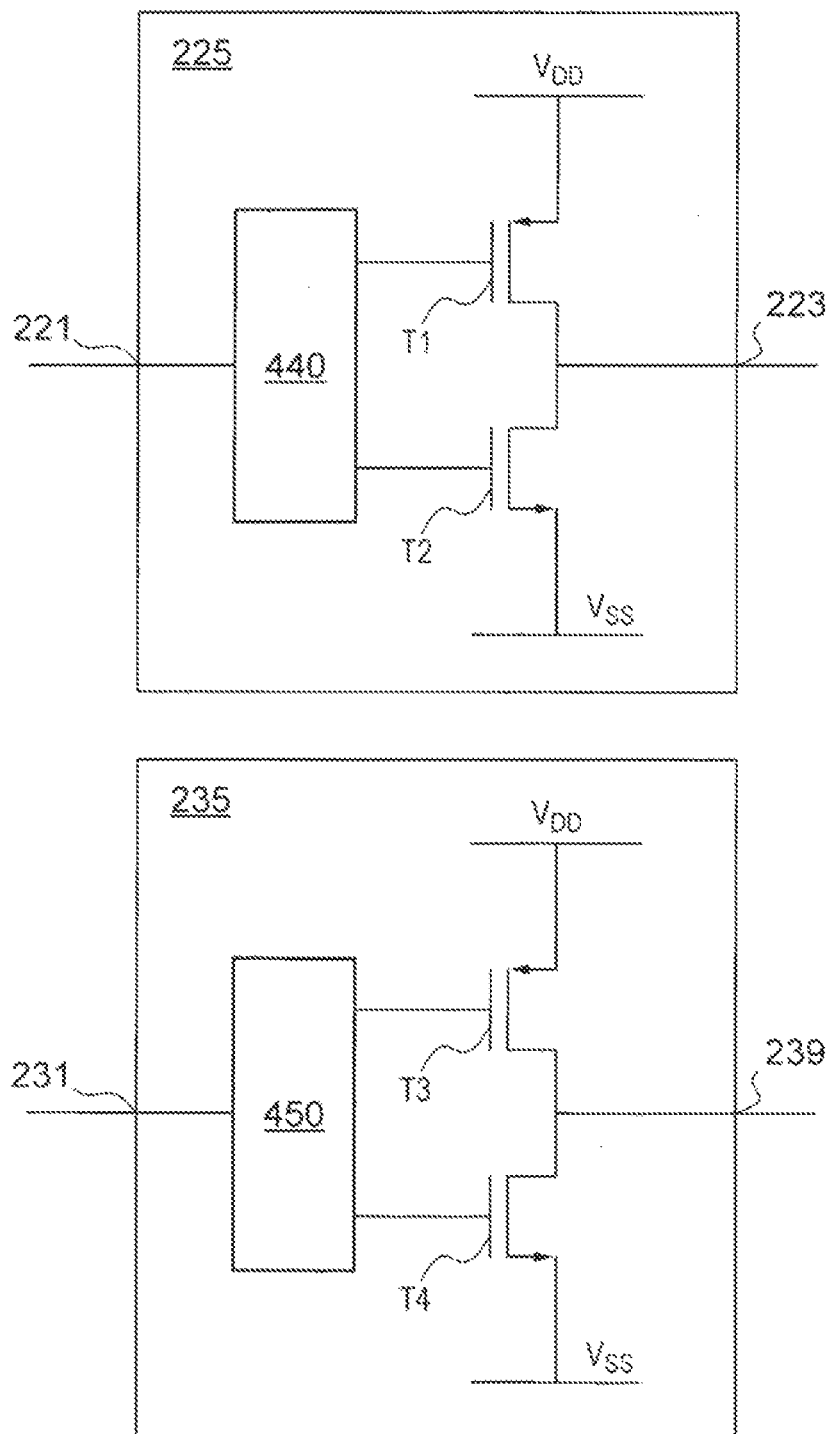
FIG. 2 is schematic diagram of an amplifier and a copy of the amplifier.

FIG. 2 provides more detail about the signal path amplifier 225 and the auxiliary amplifier 235 as a copy the signal path amplifier 225. The signal path amplifier 225 comprises p-channel metal oxide semiconductor (PMOS) transistor T1 and an n-channel metal oxide semiconductor (NMOS) transistor T2 having their drains coupled to the output 223 of the signal path amplifier 225. The signal at the input 221 of the signal path amplifier 225 is coupled to the gates of the transistors T1, T2 of the signal path amplifier 225 via a driver stage 440 which is part of the signal path amplifier 225 and which converts signals to a suitable form for driving the transistors T1, T2. Alternatively, driver circuitry may be external to the signal path amplifier 225. For example driver circuitry may be in the signal path between the first signal processing stage 210 and the routing switch 260, in which case the driver circuitry may be common to both the signal path amplifier 225 and the auxiliary amplifier 235. The source of the PMOS transistor T1 of the signal path amplifier 225 is coupled to the first supply rail providing the voltage $V_{DD}$, and the source of the NMOS transistor T2 of the signal path amplifier 225 is coupled to the second supply rail providing the lower voltage $V_{SS}$. Likewise, the auxiliary amplifier 235 comprises an identical PMOS transistor T3 and an identical NMOS transistor T4 having their drains coupled to the output 239 of the auxiliary amplifier 235. The input 231 of the auxiliary amplifier 235 is coupled to the gates of the transistors T3, T4 of the auxiliary amplifier 235 via a driver stage 450 which is part of the auxiliary amplifier 235 and which converts signals to a suitable form for driving the transistors T3, T4. Alternatively, driver circuitry may be external to the auxiliary amplifier 235. For example, as stated above, driver circuitry may be in the signal path between the first signal processing stage 210 and the routing switch 260, in which case the driver circuitry may be common to both the auxiliary amplifier 235 and the signal path amplifier 235. The source of the PMOS transistor T3 of the auxiliary amplifier 235 is coupled to the first supply rail providing the first voltage $V_{DD}$, and the source of the NMOS transistor T4 of the auxiliary amplifier 235 is coupled to the second supply rail providing the lower second voltage $V_{SS}$.

In the absence of a signal at the input 221 of the signal path amplifier 225, the output 223 of the signal path amplifier 225 is at a DC voltage determined by the transistors T1, T2 of the signal path amplifier 225, the driver stage 440 of the signal path amplifier 225 and the supply voltages $V_{DD}$ and $V_{SS}$. Typically, this DC voltage would be close to $(V_{DD}+V_{SS})/2$. Due to mismatch between the transistor T1 and the transistor T2, this voltage may differ from the desired value by a DC offset voltage. Because the auxiliary amplifier 235 is a copy of the signal path amplifier 225, DC adjustment during calibration performed with the auxiliary stage 230 can be applied when the second signal processing stage 220 is brought into operation by the routing switch 260 and the output switch 270.

Figure 3:
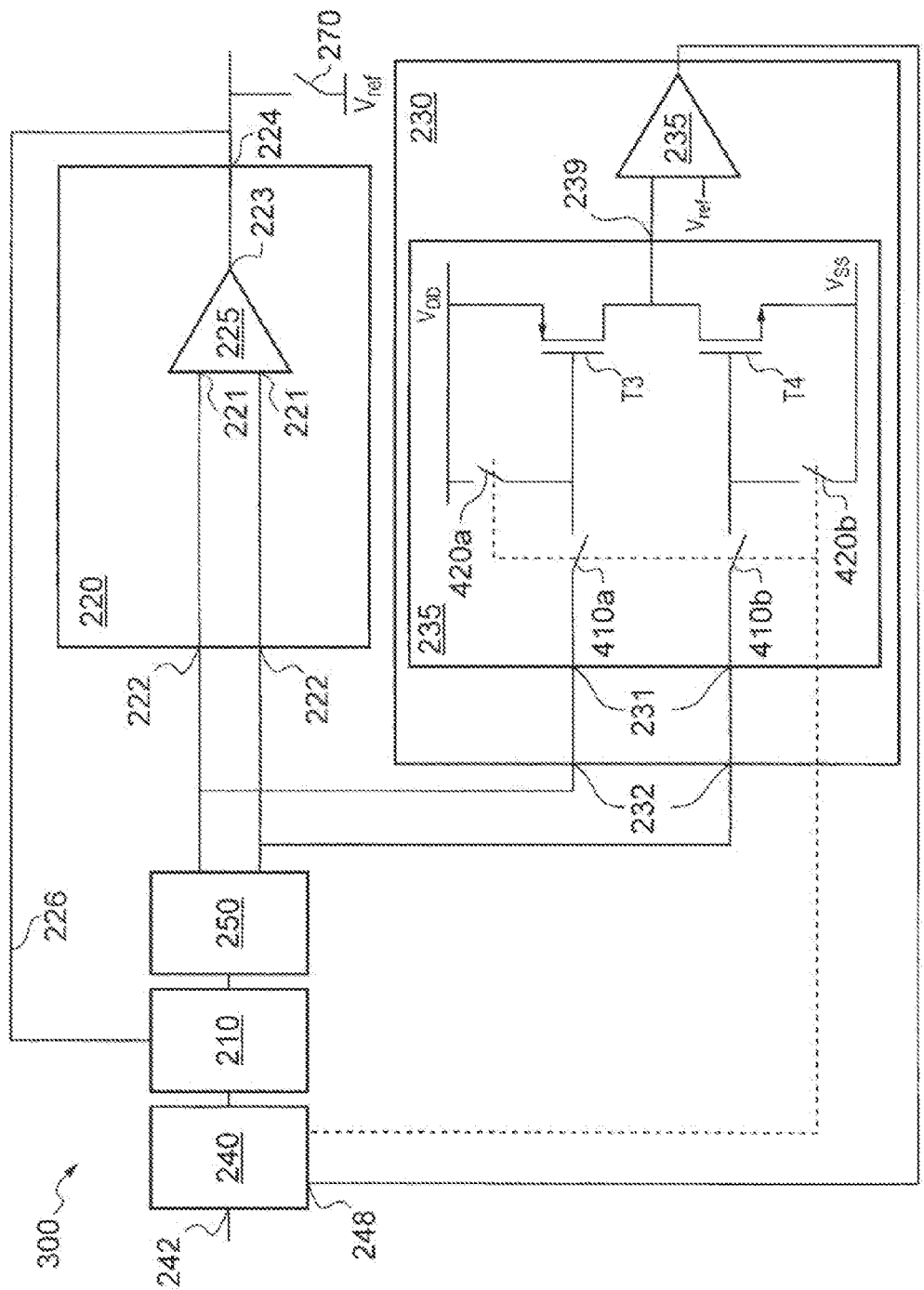
FIG. 3 is a block diagram of a signal processing apparatus with provision for power conservation.

FIG. 3 illustrates a signal processing apparatus 300 having provision for power conservation. Only the differences of the signal processing apparatus 300 over the signal processing apparatus 200 of FIG. 1 will be described. Coupled between the first signal processing stage 210 and the second signal processing stage 220 is a driver stage 250 containing driver circuitry for generating suitable drive signals for driving the transistors T1, T2 of the signal path amplifier 225 and the transistors T3, T4 of the auxiliary amplifier 235, and the signal path amplifier 225 and the auxiliary amplifier 235 are arranged to receive these drive signals. Therefore, in the signal processing apparatus 300 of FIG. 3, the driver stage 440 of the signal path amplifier 225 and the driver stage 450 of the auxiliary amplifier 235 are omitted. Furthermore, the auxiliary amplifier 235 includes switches 410a, 410b coupled between the respective gates of the transistors T3, T4 and the driver stage 250 for coupling the auxiliary amplifier 235 to the driver stage 250 and for de-coupling the auxiliary amplifier 235 from the driver stage 250. The signal path amplifier 225, although not illustrated in detail, has an identical arrangement of switches to the auxiliary amplifier 235 and therefore can also be coupled to, and decoupled from, the driver stage 250.

The presence of the switches 410a, 410b in both amplifiers 225, 235 obviates the need for the routing switch 260 as they can perform a similar routing function. Switches 410a, 410b are controlled by the calibration stage 240. In addition, there are switches 420a, 420b for coupling and decoupling the respective gates of the transistors T1, T2 of the signal path amplifier 225 and the respective gates of the transistors T3, T4 the auxiliary amplifier 235 to the first and second supply rails providing, respectively, $V_{DD}$ and $V_{SS}$. During the calibration mode, the switches 410a, 410b of the auxiliary amplifier 235 are closed, coupling the driver stage 250 to the auxiliary stage 230, and the switches 420a, 420b of the auxiliary amplifier 235 are open. During the normal operation mode, when it is not necessary for the auxiliary stage 230 to be operable, the switches 410a, 410b of the auxiliary amplifier 235 can be opened, decoupling the driver stage 250 from the auxiliary stage 230, and the switches 420a, 420b of the auxiliary amplifier 235 can be closed, thereby switching the transistors T3, T4 of the auxiliary amplifier 235 to a non-conducting state. In this way, the power consumption of the auxiliary stage 230 can be reduced. Conversely, during the calibration mode, the corresponding switches 410a, 410b of the signal path amplifier 225 may be open, decoupling the driver stage 250 from the second signal processing stage 220 if required to prevent transient voltage changes reaching a load connected to the output 224 of the second signal processing stage 220, and the switches 420a, 420b of the signal path amplifier 225 may be closed if desired to reduce the power consumption of the signal path amplifier 225. If the switches 420a, 420b of the signal path amplifier 225 are closed during the calibration mode, then the switches 410a, 410b of the signal path amplifier 225 should be open to avoid the input 232 of the auxiliary stage 230 and the input 231 of the auxiliary amplifier 235 being shorted to the first and second supply rails. During the normal operation mode, when a signal is applied at the input 242 of the signal processing apparatus 300 for processing by the signal processing apparatus 300, the switches 410a, 410b of the signal path amplifier 225 are closed for coupling the driver stage 250 to the second signal processing stage 220, and the switches 420a, 420b of the signal path amplifier 225 are open. When not being used for the calibration mode, the comparator 238 may similarly be deactivated if desired.

The signal processing apparatus 200 or 300 may include additional, non-illustrated elements in the signal path preceding the variable calibration stage 240, and/or between the calibration stage 240 and the first signal processing stage 210, and/or between the first signal processing stage 210 and the routing switch 260 or between the first signal processing stage 210 and the driver stage 250.

Although embodiments have been described in which adjustment of the DC level in the signal path is performed in the calibration stage 240, this is not essential and instead the DC level may be adjusted elsewhere in the signal path preceding the output of the first signal processing stage 210, for example in the first signal processing stage 210 itself.

Although embodiments have been described in which the feedback path 226 is coupled to the signal path in the first signal processing stage 210, this is not essential and alternatively the feedback path 226 may coupled to the signal path at any location preceding the output of the first signal processing stage 210. The feedback path 226 may include non-illustrated components.

Although embodiments have been described in which the feedback path 226 is coupled to the output 224 of the signal processing apparatus 200 and, in the calibration mode, is also coupled to the reference voltage $V_{ref}$ by means of the output switch 270, it is not essential for the feedback path 226 to remain coupled to the output 224 of the signal processing apparatus 200 in the calibration mode, and alternative arrangements for coupling the feedback path 226 to the reference voltage $V_{ref}$ in the calibration mode may be used.

Although embodiments have been described in which the auxiliary amplifier 235 is operated without feedback, that is open loop, this is not essential, and feedback may be employed.

Although embodiments have been described in which the auxiliary stage 230 comprises the auxiliary amplifier 235 which is a copy of the signal path amplifier 225 in the second signal processing stage 220, the auxiliary amplifier 235 may be a scaled copy of the signal path amplifier 225, for example having the same operating voltages as the signal path amplifier 225, but having currents that are a scaled copy of the currents in the signal path amplifier 225. In particular, the transistors T3, T4 of the auxiliary amplifier 235 may have one or more physical dimensions that are a scaled down copy of one or more physical dimensions of the transistors T1, T2 of the signal path amplifier 225.

Although embodiments have been described in which the second signal processing stage 220 comprises the signal path amplifier 225, the second signal processing stage 220 may comprise an alternative or additional device, and provide processing other than, or additional to, amplification.

Although embodiments have been described in which the auxiliary amplifier 235 is a copy of the signal path amplifier 225, this is not essential. An alternative device which is not a copy, and which need not be an amplifier, may be employed in place of the auxiliary amplifier 235 for generating the control signal. For example, a comparator may be employed.

Although embodiments have been described in which the auxiliary stage 230 is de-coupled from the first signal processing stage 210 during the normal operation mode, this is not essential and instead the auxiliary stage may remain coupled during the normal operation mode. Nevertheless, the calibration stage 240 should adjust the DC level in the signal path only during the calibration mode in order to avoid transient noise occurring at the output 224 of the signal processing apparatus 200, 300.

The calibration stage 240 may adjust the DC level in the signal path in the analogue domain or in the digital domain. The first signal processing stage 210 may perform signal processing in the analogue or digital domain. Analogue to digital or digital to analogue conversion between domains may be provided where appropriate.

References to a DC level, DC offset and DC effect may represent either voltage or a current, for example, a DC voltage level, a DC current level, a DC voltage offset or a DC current offset.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfill the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. A signal processing apparatus comprising:
a signal path including first and second signal processing stages for processing a signal;
a switch for, in a first state, coupling an output of the first signal processing stage to an input of the second signal processing stage, and, in a second state, de-coupling the output of the first signal processing stage from the input of the second signal processing stage;
an auxiliary stage, coupled to the output of the first signal processing stage, arranged to generate a control signal dependent on a DC level at the output of the first signal processing stage and on a DC level in the auxiliary stage and indicative of a DC offset at an output of the second signal processing stage; and a calibration block for, responsive to the control signal and adapted to adjust a DC level in the signal path at a location preceding the output of the first signal processing stage when the switch means is in the second state.

2. The signal processing apparatus as claimed in claim 1, wherein the second signal processing stage is enabled by the switch means to receive a supply of power when the switch means is in the first state and at least part of the second signal processing stage is disabled by the switch means from receiving the supply of power when the switch means is in the second state.

3. The signal processing apparatus as claimed in claim 1, wherein the auxiliary stage is coupled to the first signal processing stage by the switch means when the switch means is in the second state.

4. The signal processing apparatus as claimed in claim 1, wherein the second signal processing stage comprises a first amplifier and the auxiliary stage comprises a second amplifier, wherein the second amplifier is a copy of the first amplifier.

5. The signal processing apparatus as claimed in claim 4, wherein the second signal processing stage comprises a feedback path adapted to operate the first amplifier with feedback, and wherein the second amplifier is arranged to be operated without feedback.

6. The signal processing apparatus as claimed in claim 5, wherein the feedback path couples an output of the second signal processing stage to the signal path at a location preceding the output of the first signal processing stage.

7. The signal processing apparatus as claimed in claim 6, wherein the switch means is arranged to, in the second state, couple the output of the second signal processing stage to a reference voltage and, in the first state, de-couple the output of the second signal processing stage from the reference voltage.

8. The signal processing apparatus as claimed in claim 4, wherein the first amplifier comprises at least one first transistor, and wherein the second amplifier comprises at least one second transistor having one or more physical dimensions that are a scaled down copy of one or more physical dimensions of the at least one first transistor.

9. The signal processing apparatus as claimed in claim 8, wherein the at least one first transistor comprises a first p-channel metal oxide semiconductor, PMOS, transistor and a first p-channel metal oxide semiconductor, NMOS, transistor with their gates coupled to an input of the first amplifier and their drains coupled to an output of the first amplifier, and wherein the at least one second transistor comprises a second PMOS transistor and a second NMOS transistor with their gates coupled to an input of the second amplifier and their drains coupled to an output of the second amplifier.

10. The signal processing apparatus as claimed in claim 1, further comprising power conservation circuitry adapted to conserve power by disabling at least part of the auxiliary stage between adjustments of the DC level.

11. A method of operating a signal processing apparatus comprising a signal path including first and second signal processing stages for processing a signal and comprising an auxiliary stage coupled to an output of the first signal processing stage, the method comprising:
 a method for processing the signal, comprising coupling the output of the first signal processing stage to an input of the second signal processing stage; and
 a method for calibrating the signal processing apparatus comprising:
  de-coupling the output of the first signal processing stage from the input of the second signal processing stage,
  generating in the auxiliary stage a control signal dependent on a DC level at the output of the first signal processing stage and on a DC level in the auxiliary stage and indicative of a DC offset at an output of the second signal processing stage, and
  adjusting, responsive to the control signal, a DC level in the signal path at a location preceding the output of the first signal processing stage.

* * * * *